US006929963B1

(12) United States Patent
Kim

(10) Patent No.: US 6,929,963 B1
(45) Date of Patent: Aug. 16, 2005

(54) SEMICONDUCTOR COMPONENT AND METHOD OF MANUFACTURE AND MONITORING

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 148 days.

(21) Appl. No.: 10/358,850

(22) Filed: Feb. 5, 2003

(51) Int. Cl.[7] .............................................. H01L 21/00
(52) U.S. Cl. ........................ 438/11; 438/12; 438/18; 324/537; 324/719; 324/763
(58) Field of Search ................................ 324/537, 719, 324/763; 438/11, 12, 18

(56) References Cited

U.S. PATENT DOCUMENTS

| 3,983,479 A | * | 9/1976 | Lee et al. | .................... 324/537 |
| 5,264,377 A | * | 11/1993 | Chesire et al. | ................ 438/11 |
| 5,472,774 A | * | 12/1995 | Goad et al. | .................. 428/209 |
| 6,768,323 B1 | * | 7/2004 | Hau-Riege et al. | ......... 324/719 |

* cited by examiner

Primary Examiner—David Nelms
Assistant Examiner—Dao H. Nguyen
(74) Attorney, Agent, or Firm—Rennie William Dover; Paul Drake

(57) ABSTRACT

A semiconductor component having a monitoring structure suitable for monitoring metal migration of a metallization system and a method for manufacturing the semiconductor component. A semiconductor substrate is provided having a major surface. A first extrusion monitoring element is formed over the major surface. A notched test element is formed over the first extrusion monitoring element. A second extrusion monitoring element is formed over the notched test element. A current is conducted through the notched test element. The resistance between the notched test element and at least one of the first and second extrusion monitoring elements is monitored to determine if a short has been created.

17 Claims, 5 Drawing Sheets

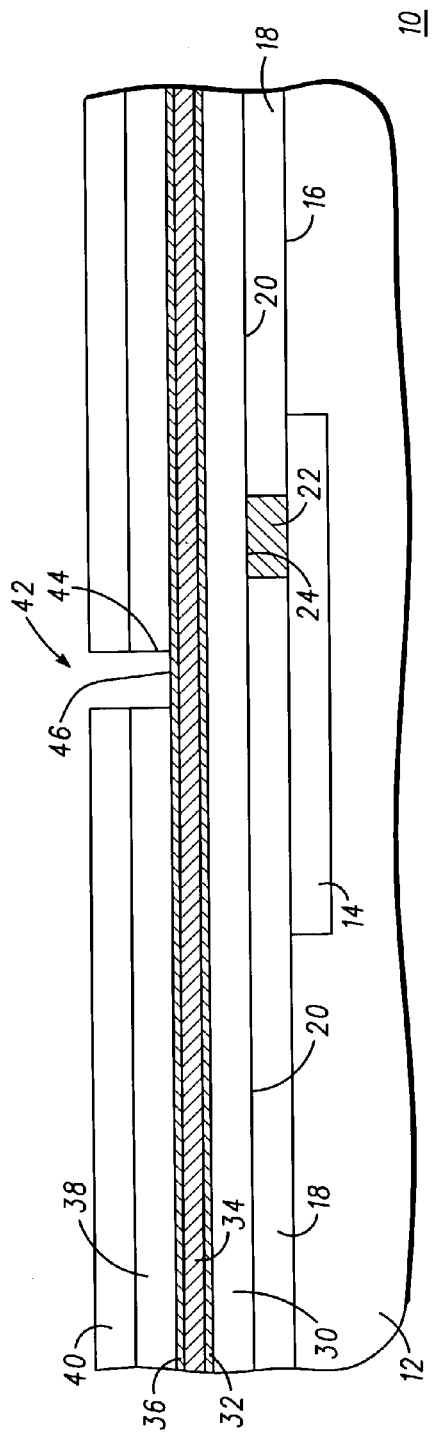
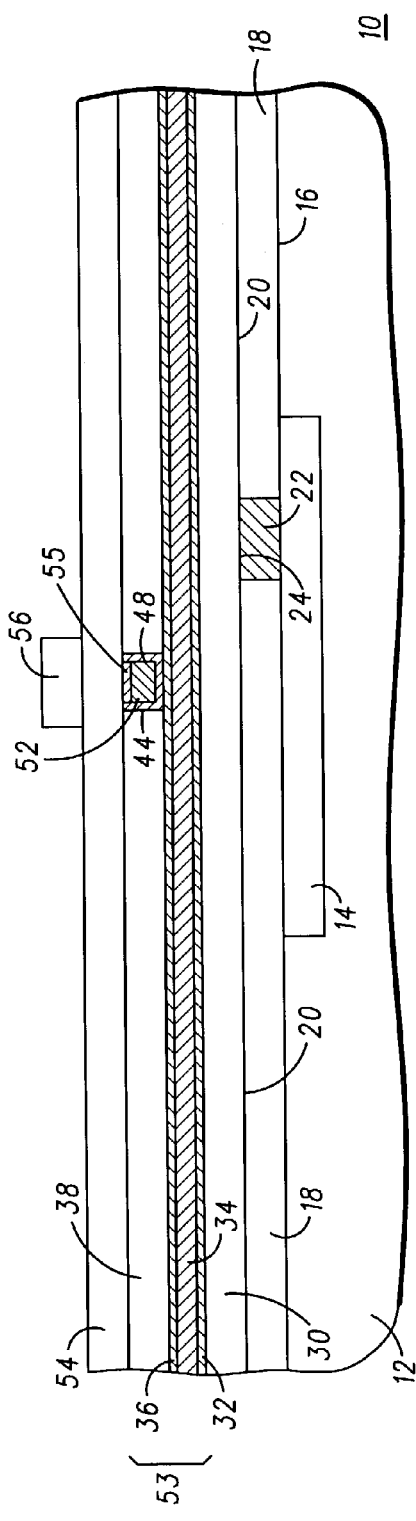

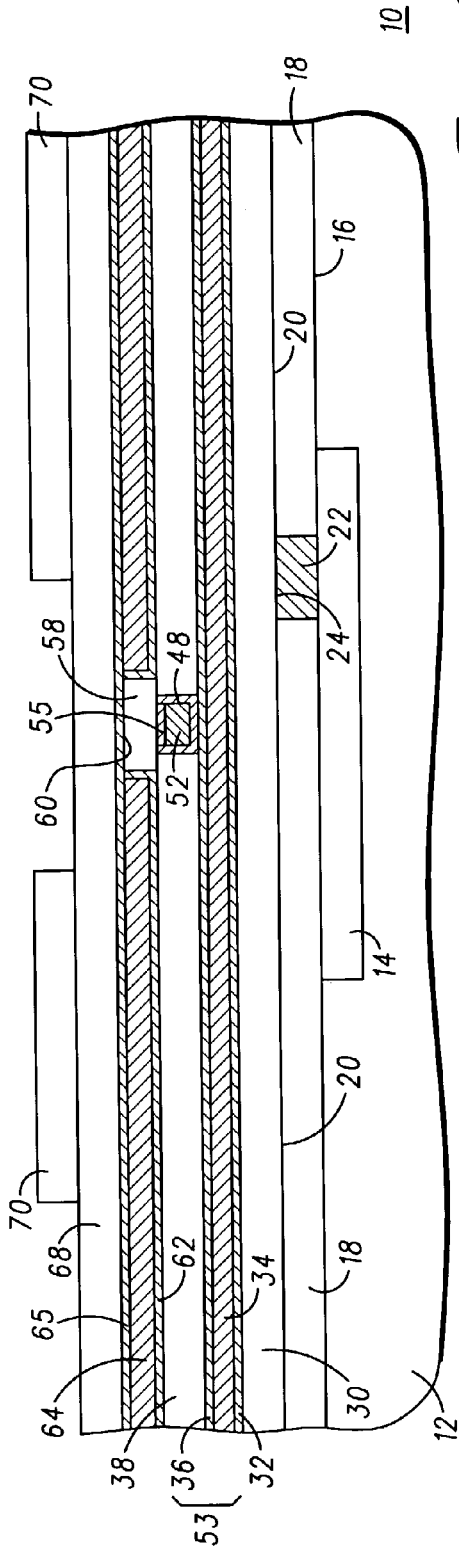
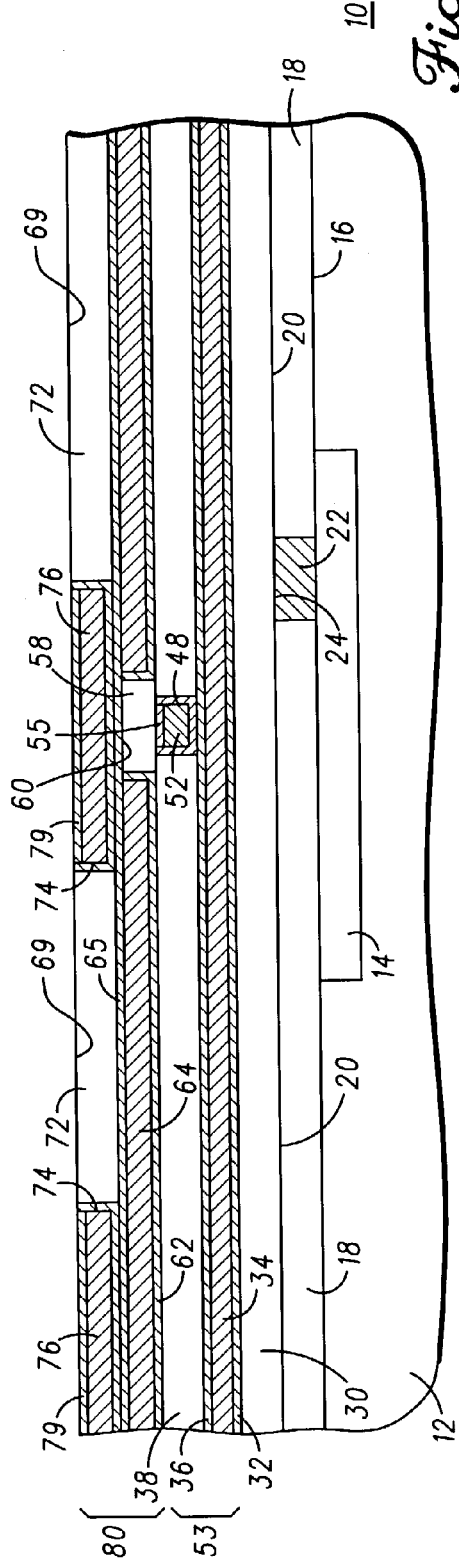

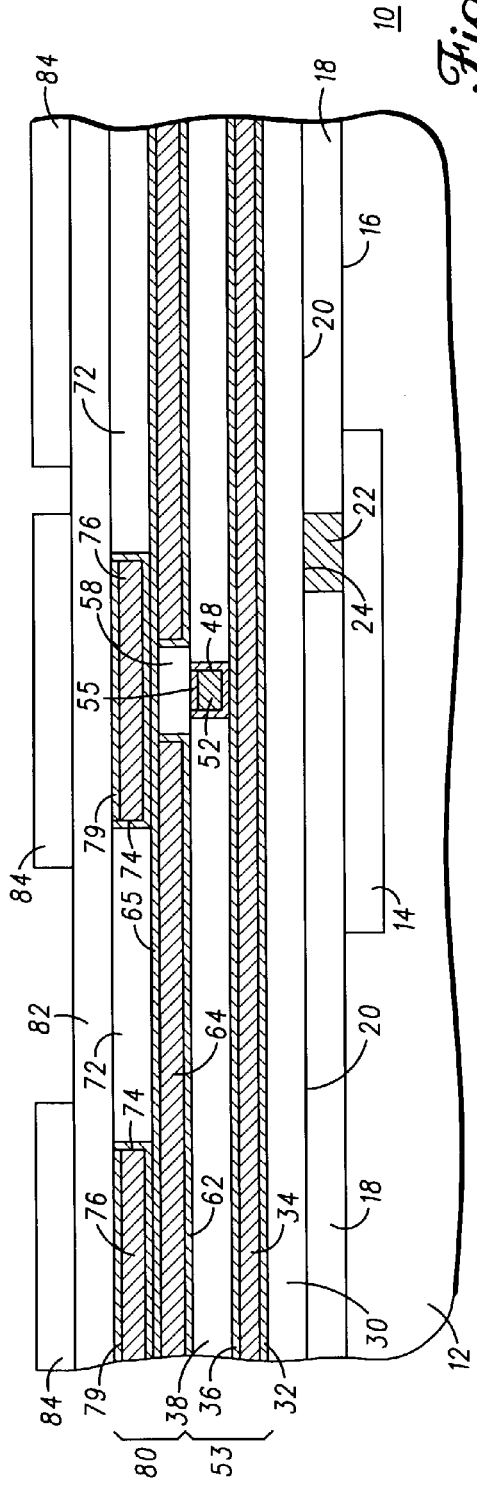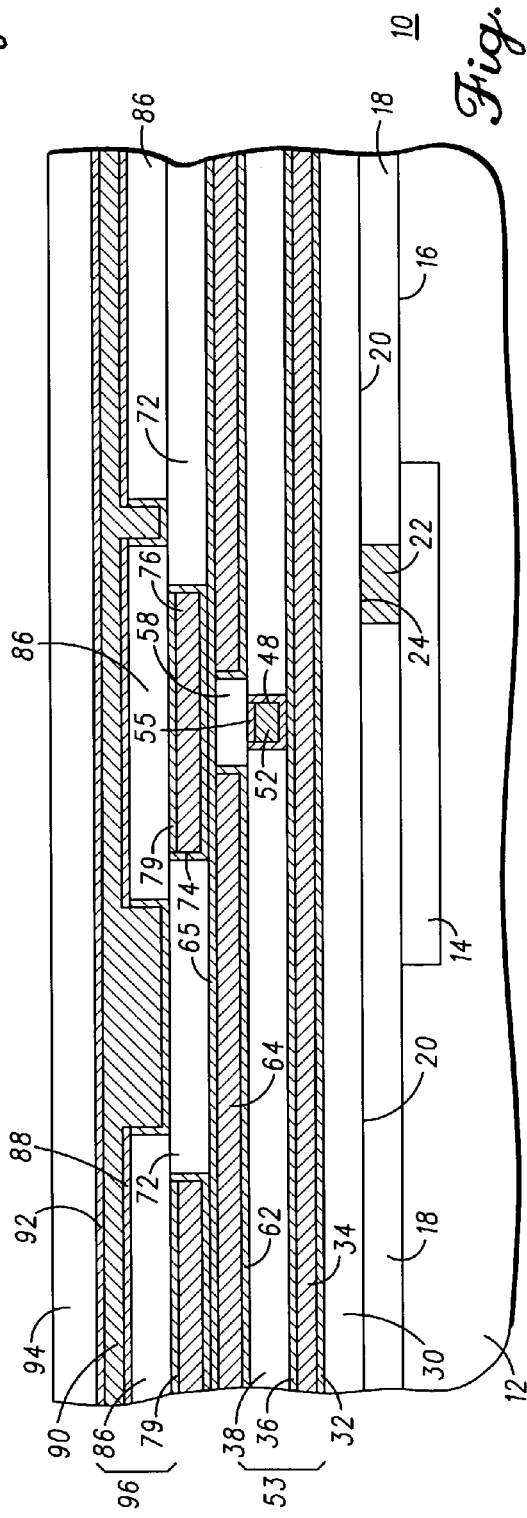

US 6,929,963 B1

SEMICONDUCTOR COMPONENT AND METHOD OF MANUFACTURE AND MONITORING

FIELD OF THE INVENTION

The present invention relates, in general, to semiconductor components and, more particularly, to semiconductor components having an extrusion monitoring structure.

BACKGROUND OF THE INVENTION

Semiconductor component manufacturers are constantly striving to increase the speed of their components. Because a semiconductor component, such as a microprocessor, contains up to a billion transistors or devices, the focus for increasing speed has been to decrease gate delays of the semiconductor devices that make up the semiconductor component. As a result, the gate delays have been decreased to the point that speed is now primarily limited by the propagation delay of the metallization system used to interconnect the semiconductor devices with each other and with elements external to the semiconductor component. Metallization systems are typically comprised of a plurality of interconnect layers vertically separated from each other by a dielectric material and electrically coupled to each other by metal-filled vias or conductive plugs. Each layer contains metal lines, metal-filled vias, or combinations thereof separated by an insulating material. A figure of merit describing the delay of the metallization system is the Resistor-Capacitance (RC) delay. The RC delay can be derived from the resistance of the metal layer and the associated capacitance within and between different layers of metal in the metallization system.

The RC delay can be reduced by lowering either the capacitance of the metallization system, the resistance of the metallization system, or both. The capacitance can be lowered by decreasing the dielectric constant of the dielectric material and/or increasing the thickness of the dielectric material. The resistance of the metallization system can be lowered by decreasing the resistivity of the metallic interconnect layers, decreasing the resistivity of the conductive plugs that electrically couple the interconnect layers to each other, decreasing the length of the metallic interconnect, or increasing the thickness of the metal. Increasingly, semiconductor manufacturers are switching to metallization systems comprising copper because of its low resistivity and dielectric material having a low dielectric constant, i.e., low κ dielectrics. A drawback of this type of metallization system is that as the current density is increased, copper extrusion occurs which shorts adjacent conductor lines thereby causing the semiconductor component to fail. Detection of these types of shorts can be very difficult because of the number of metallization layers in high performance semiconductor components and their complex routing structure.

Accordingly, what is needed is a semiconductor component having an extrusion monitoring structure and a method for manufacturing the semiconductor component and monitoring the integrity of the metallization system.

SUMMARY OF THE INVENTION

The present invention satisfies the foregoing need by providing a semiconductor component having a metallization monitoring structure, a method for monitoring extrusion in a metallization system of a semiconductor component, and a method for manufacturing the monitoring structure. In accordance with one aspect, the present invention comprises a semiconductor component having a monitoring structure suitable for monitoring metal migration of a metallization system. The semiconductor component comprises first and second extrusion monitoring elements overlying a major surface of a semiconductor substrate. A test element is positioned between the first and second extrusion elements.

In accordance with another aspect, the present invention includes a method for monitoring extrusion in a metallization system of a semiconductor component. A semiconductor substrate is provided and first and second extrusion monitoring elements are formed over the semiconductor substrate. A test element is formed between the first and second extrusion monitoring elements. A test signal is applied through the test element, and a response parameter is monitored. The condition of the metallization system is indicated by the state of the response parameter.

In accordance with yet another aspect, the present invention comprises a method for manufacturing a monitoring structure which includes forming a test element between two extrusion monitoring elements.

BRIEF DESCRIPTION OF THE DRAWINGS

The present invention will be better understood from a reading of the following detailed description, taken in conjunction with the accompanying drawing figures, in which like reference numbers designate like elements and in which:

FIGS. 1–6 are enlarged cross-sectional side views of a semiconductor component during manufacture in accordance with an embodiment of the present invention;

DETAILED DESCRIPTION

Figure 7:
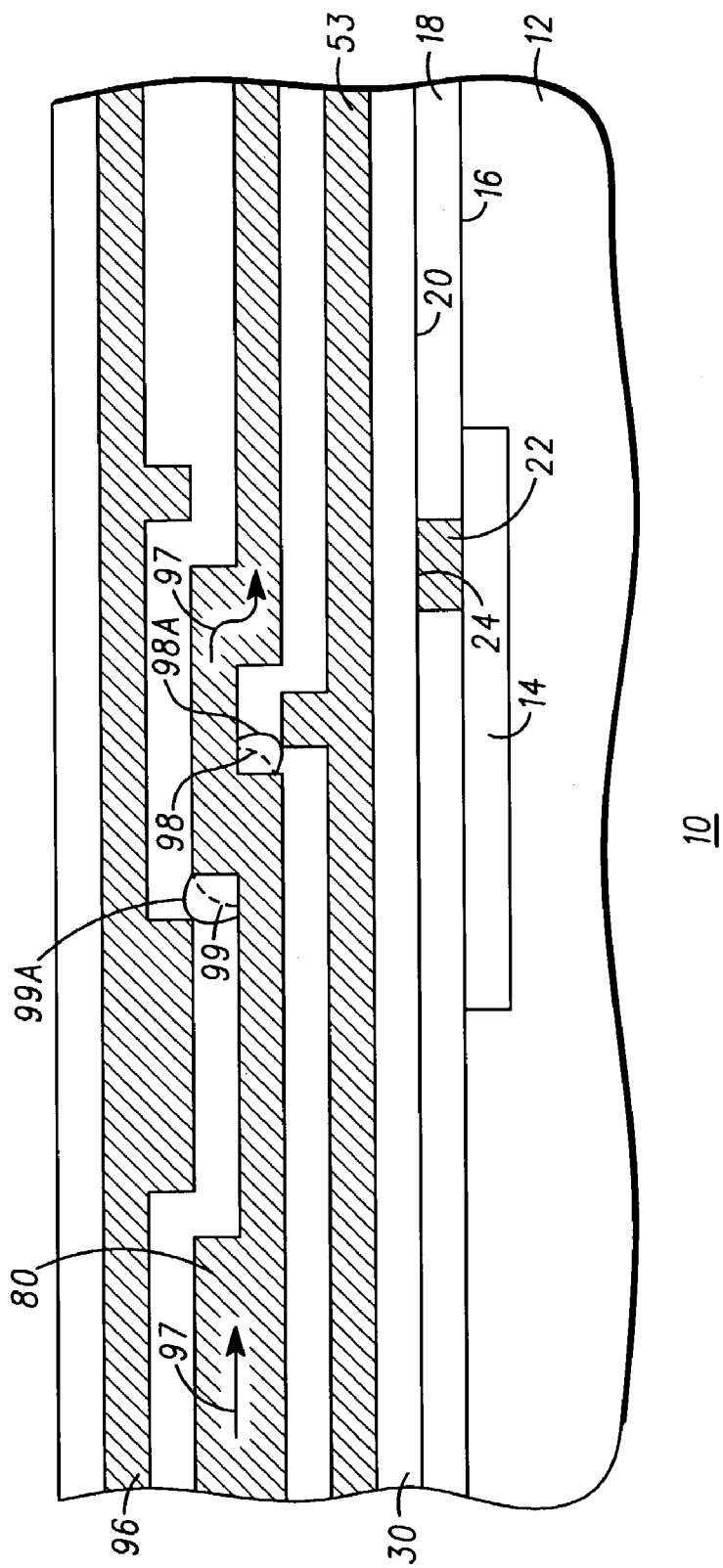
FIG. 7 is an enlarged cross-sectional side view of the semiconductor component during operation.

Generally, the present invention provides a semiconductor component, a method for manufacturing a monitoring structure for use in the semiconductor component, and a method for monitoring the condition or state of a metallization system in the semiconductor component. In one aspect, the semiconductor component includes a semiconductor device formed in or from a semiconductor material and a metallization test structure formed over the semiconductor material. The semiconductor material is also referred to as a semiconductor substrate. In one embodiment, the metallization test structure comprises an active metal interconnect vertically positioned between a pair of passive metal interconnects, where the active metal interconnect includes a vertically oriented notch. One of the passive metal interconnects includes an extension or protrusion aligned to the notch.

In another embodiment, the active metal interconnect has vertically oriented notches on both top and bottom sides. In other words, a first vertically oriented notch extends into the top side of the active metal interconnect, i.e., towards the semiconductor substrate and a second vertically oriented notch extends into the second or bottom side of the active metal interconnect, i.e., away from the semiconductor substrate. The passive metal interconnect on the top side has an extension aligned to the first notch in the active metal interconnect and the passive metal interconnect on the bottom side has an extension aligned to the second notch in the active metal interconnect.

In yet another embodiment, the metallization test structure comprises an active metal interconnect positioned between a pair of passive metal interconnects, where the active metal interconnect includes a laterally oriented notch positioned on one side. One of the passive metal interconnects includes an extension or protrusion aligned to the notch.

In yet another embodiment, the active metal interconnect has laterally oriented notches on both sides. In other words, a first laterally oriented notch extends into a first side of the active metal interconnect, i.e., towards the semiconductor substrate and a second laterally oriented notch extends into the second or opposite side of the active metal interconnect, i.e., away from the semiconductor substrate. The passive metal interconnect on the first side has an extension aligned to the first notch in the active metal interconnect and the passive metal interconnect on the second side has an extension aligned to the second notch in the active metal interconnect.

In yet another embodiment, the metallization test structure comprises an active metal interconnect vertically positioned between upper and lower passive metal interconnects and laterally positioned between adjacent passive metal interconnects, where the active metal interconnect includes a vertically oriented notch and a laterally oriented notch. At least one of the upper and lower passive metal interconnects includes an extension or protrusion aligned to the notch and at least one of the laterally adjacent passive metal interconnects.

The active metal interconnect is referred to as being active because it is used to conduct electrons. In the absence of a short, the passive metal interconnects do not conduct electrons, hence they are referred to as passive metal interconnects. When the active metal interconnect is formed using a damascene process, it is referred to as a damascene structure. Likewise, when the passive metal interconnects are formed using a damascene process, they are referred to as damascene structures. The damascence strucutre may be formed using a single damascene process to form single damascene structures or using a dual damascene process to form dual damascene structures.

In yet another aspect, the present invention includes a method of monitoring the condition or state of the metallization system. The condition of the metallization system is monitored by applying a current to the active metal interconnect and measuring an electrical parameter, such as resistance, between the active metal interconnect and one of the vertically or laterally positioned passive metal interconnects. If the resistance is high, e.g., nearly infinite, the active metal interconnect is electrically isolated from the passive metal interconnects. A low resistance, e.g., approximately zero, indicates that some of the metal from the active metal interconnect has extruded or migrated into the adjacent dielectric material and contacted the passive metal interconnect. In other words, a short has been created indicating a change in state in the metallization system such that it has failed. Because the metal of the active metal interconnect has migrated or become extruded, the passive metal interconnects are referred to as extrusion monitoring elements and the active metal interconnect is referred to as a test element or a notched test element. Because of the presence of notches and or extensions, the notched test element is also referred to as a non-continuous test element. In addition, the notches are referred to as U-shaped portions. It should be understood that the term U-shaped is intended to include notch or extension shapes having corners and substantially planar portions in addition to having the rounded bottom shape of a U.

FIG. 1 is an enlarged cross-sectional side view of a semiconductor component 10 during an intermediate stage of manufacture in accordance with an embodiment of the present invention. What is shown in FIG. 1 is a portion of a semiconductor substrate 12 in which a semiconductor device 14 has been fabricated. Semiconductor substrate 12 has a major surface 16. It should be understood that semiconductor device 14 has been shown in block form and that the type of semiconductor device and the number of semiconductor devices are not limitations of the present invention. Suitable semiconductor devices include active elements such as, for example, insulated gate field effect transistors, complementary insulated gate field effect transistors, junction field effect transistors, bipolar junction transistors, diodes, and combinations thereof, as well as passive elements such as, for example, capacitors, resistors, and inductors. Likewise, the material of semiconductor substrate 12 is not a limitation of the present invention. Substrate 12 can be silicon, Silicon-On-Insulator (SOI), Silicon-On-Sapphire (SOS), silicon germanium, germanium, an epitaxial layer of silicon formed on a silicon substrate, or the like. In addition, semiconductor substrate 12 may be comprised of compound semiconductor materials such as gallium-arsenide, indium-phosphide, or the like.

A dielectric material 18 having a major surface 20 is formed on semiconductor substrate 12 and an electrically conductive portion 22 having a major surface 24 is formed in a portion of dielectric material 18. By way of example, electrically conductive portion 22 is metal. Metal layer 22 may be referred to as Metal-1 or a lower electrically conductive level. The combination of dielectric material 18 and electrically conductive portion 22 is referred to as an interconnect layer. When electrically conductive portion 22 is metal, the interconnect layer is also referred to as a metal interconnect layer. Techniques for forming semiconductor devices such as device 14, dielectric material 18, and metal layer 22 are known to those skilled in the art.

A layer of dielectric or insulating material 30 having a thickness ranging between approximately 100 Angstroms (Å) and approximately 10,000 Å is formed on major surfaces 20 and 24. Preferably, insulating layer 30 has a thickness ranging between 1,000 Å and 5,000 Å. By way of example, dielectric layer 30 is silicon dioxide ($SiO_2$) having a thickness of about 2,500 Å. Other suitable materials for dielectric layer 30 include silicon nitride (SiN), diamond-like carbon (DLC), and hydrogenated oxidized silicon carbon material (SiCOH). In addition, the material of dielectric layer 30 may be an organic dielectric material such as, for example, polyimide, spin-on polymers, poly(arylene ether) (PAE), parylene, xerogel, fluorinated aromatic ether (FLARE), fluorinated polyimide (FPI), dense SiLK, porous SiLK (p-SiLK), polytetrafluoroethylene, and benzocyclobutene (BCB). Suitable inorganic low KC dielectric materials include, but are not limited to, hydrogen silsesquioxane (HSQ), methyl silsesquioxane (MSQ), fluorinated glass, or NANOGLASS. It should be understood that the type of dielectric material for dielectric layer 30 is not a limitation of the present invention and that other organic and inorganic dielectric materials may be used. Similarly, the method for forming dielectric layer 30 is not limitation of the present invention. For example, insulating layer 30 may be formed using, among other techniques, spin-on coating, spray-on coating, Chemical Vapor Deposition (CVD), Plasma Enhanced Chemical Vapor Deposition (PECVD), Physical Vapor Deposition (PVD), sputter deposition, reactive sputter deposition, ion-beam deposition, or the like.

A barrier layer 32 having a thickness ranging between approximately 10 Å and approximately 1,000 Å is formed on dielectric layer 30. By way of example, barrier layer 32 is a tantalum layer formed using Chemical Vapor Deposition (CVD), Plasma Enhanced Chemical Vapor Deposition (PECVD), sputtering, evaporation, or the like. Tantalum layer 32 serves as a barrier layer to prevent diffusion from a subsequently deposited metal into insulating layer 30 or into semiconductor device 14. In addition, tantalum layer 32 provides a low contact resistance between an underlying conductive layer (not shown) and a subsequently deposited electrically conductive layer 34. Other suitable materials for barrier layer 32 include titanium, titanium nitride, tantalum nitride, a combination of tantalum and tantalum nitride, tungsten (W), tungsten nitride (WN), titanium silicon nitride (TiSiN), and refractory metal compounds such as refractory metal nitrides, refractory metal carbides, or refractory metal borides.

A film or layer of an electrically conductive material 34 having a thickness ranging between approximately 100 Å and approximately 9,000 Å is formed on barrier layer 32. By way of example, layer 34 is copper which is plated on barrier layer 32. Techniques for plating copper on a barrier layer are known to those skilled in the art. Optionally, copper layer 34 is planarized using chemical mechanical planarization. The technique for planarizing copper layer 34 is not a limitation of the present invention. Other suitable planarization techniques include electropolishing, electrochemical polishing, chemical polishing, and chemical enhanced planarization. Alternatively, layer 34 may be aluminum or silver. A barrier layer 36 having a thickness ranging between approximately 10 Å and approximately 1,000 Å is formed on copper layer 34. Barrier layer 36 may be made using the same processing techniques and the same material as barrier layer 32 as described hereinbefore. Barrier layer 36 prevents diffusion of the electrically conductive material of layer 34, e.g., copper, into other portions of semiconductor 10 which would decrease its reliability.

A layer of dielectric or insulating material 38 having a thickness ranging between approximately 100 Angstroms and approximately 10,000 Å is formed on barrier layer 36. Preferably, dielectric layer 38 has a thickness ranging between 1,000 Å and 5,000 Å. By way of example, dielectric layer 38 has a thickness of about 2,500 Å and comprises a low dielectric constant (low κ) material, i.e., a material having a dielectric constant lower than that of silicon dioxide, silicon nitride, and hydrogenated oxidized silicon carbon material (SiCOH). Suitable organic dielectric materials include, but are not limited to, polyimide, spin-on polymers, poly(arylene ether) (PAE), parylene, xerogel, fluorinated aromatic ether (FLARE), fluorinated polyimide (FPI), dense SiLK, porous SiLK (p-SiLK), polytetrafluoroethylene, and benzocyclobutene (BCB). Suitable inorganic low κ dielectric materials include, but are not limited to, hydrogen silsesquioxane (HSQ), methyl silsesquioxane (MSQ), fluorinated glass, or NANOGLASS. It should be understood that the type of dielectric material for dielectric layer 38 is not a limitation of the present invention and that other organic and inorganic low κ dielectric materials may be used. Similarly, the method for forming dielectric layer 38 is not limitation of the present invention. For example, dielectric layer 38 may be formed using, among other techniques, spin-on coating, Chemical Vapor Deposition (CVD), Plasma Enhanced Chemical Vapor Deposition (PECVD), or Physical Vapor Deposition (PVD).

Still referring to FIG. 1, a layer of photoresist is patterned on dielectric layer 38 to have an opening 42. The portion of dielectric layer 38 exposed by opening 42, i.e., the portions not underlying photoresist layer 40, are etched using an anisotropic reactive ion etch to form opening 42 having sidewalls 44. Opening 42 exposes a portion 46 of barrier layer 36. The anisotropic etch stops or terminates in or on portion 46 of barrier layer 36. Photoresist layer 40 is removed using techniques known to those skilled in the art.

Referring now to FIG. 2, a barrier layer 48 having a thickness ranging between approximately 10 Å and approximately 1,000 Å is formed on dielectric layer 38 and on sidewalls 44 and portion 46 of barrier layer 36. By way of example, barrier layer 48 is a tantalum layer formed using Chemical Vapor Deposition (CVD), Plasma Enhanced Chemical Vapor Deposition (PECVD), sputtering, evaporation, or the like. In accordance with one embodiment, barrier layer 48 is tantalum which prevents diffusion from a subsequently deposited metal, e.g., copper, into dielectric layer 38. In addition, barrier layer 48 provides a low contact resistance between copper layer 34 and a subsequently deposited electrically conductive layer and reduces electromigration. Other suitable materials for barrier layer 48 include titanium, titanium nitride, tantalum nitride, a combination of tantalum and tantalum nitride, tungsten (W), tungsten nitride (WN), titanium silicon nitride (TiSiN), and refractory metal compounds such as refractory metal nitrides, refractory metal carbides, or refractory metal borides.

A film or layer of an electrically conductive material having a thickness ranging between approximately 100 Å and approximately 9,000 Å is formed on barrier layer 48. The film has a thickness at least as great as the depth of opening 42. By way of example, the layer is formed by plating copper on barrier layer 48. A portion 52 of the copper film fills barrier-lined opening 42. Techniques for plating copper on a barrier layer are known to those skilled in the art. Alternatively, the layer of conductive material may be aluminum or silver. The copper film is planarized using, for example, a Chemical Mechanical Polishing (CMP) technique having a high selectivity to dielectric layer 38. Thus, the planarization stops on dielectric layer 38. After planarization, portion 52 of the copper film remains in opening 42 (shown in FIG. 1). As those skilled in the art are aware, Chemical Mechanical Polishing is also referred to as Chemical Mechanical Planarization. It should be understood the planarization technique is not a limitation of the present invention. For example, other planarization techniques include electropolishing, electrochemical polishing, chemical polishing, and chemical enhanced planarization.

A barrier layer 55 having a thickness ranging between approximately 10 Å and approximately 1,000 Å is formed on copper film 52. Preferably barrier layer 55 is made using the same material and processing techniques as barrier layer 48 which was described with reference to FIG. 2. Portion 52 cooperates with layers 32, 34, 36, 48, and 55 to form an extrusion monitoring element 53.

A layer of dielectric or insulating material 54 having a thickness ranging between approximately 100 Angstroms and approximately 10,000 Å is formed on dielectric layer 38 and barrier layer 55. Preferably, dielectric layer 54 has a thickness ranging between 1,000 Å and 5,000 Å. By way of example, dielectric layer 54 has a thickness of about 2,500 Å and comprises a low κ dielectric material. Suitable examples of low κ dielectric materials have been described hereinbefore with reference to FIG. 1. A layer of photoresist is formed on dielectric layer 54. The photoresist layer is patterned such that a portion 56 remains over dielectric layer 54.

Referring now to FIG. 3, dielectric layer 54 is anisotropically etched using an anisotropic reactive ion etch. The anisotropic etch stops or terminates in or on dielectric layer 38. The portion 58 of dielectric layer 54 having top surface 60 underlying photoresist portion 56 (shown in FIG. 2) is protected from the anisotropic etch and remains after the anisotropic etch. Photoresist portion 56 is removed using techniques known to those skilled in the art.

A barrier layer 62 having a thickness ranging between approximately 10 Å and approximately 1,000 Å is formed on dielectric portion 58 of dielectric layer 54 and on the portions of dielectric layer 38 not covered by portion 56. Preferably barrier layer 62 is made from the same material as barrier layer 48 using the processing techniques described with reference to FIG. 2. A film or layer of an electrically conductive material 64 having a thickness ranging between approximately 100 Å and approximately 9,000 Å is formed on barrier layer 62. By way of example, layer 64 is copper which is plated on barrier layer 62. Copper film 64 and the portion of barrier layer 62 over top surface 60 of dielectric portion 58 are planarized using, for example, a Chemical Mechanical Polishing (CMP) technique having a high selectivity to dielectric portion 58. Thus, the planarization stops on dielectric portion 58. It should be understood the planarization technique is not a limitation of the present invention. A barrier layer 65 having a thickness ranging between approximately 10 Å and approximately 1,000 Å is formed on dielectric portion 58 and on the planarized portions of copper layer 64. Preferably barrier layer 65 is made using the same material and processing techniques as barrier layer 48 as described with reference to FIG. 2.

A layer of dielectric or insulating material 68 having a thickness ranging between approximately 100 Angstroms and approximately 10,000 Å is formed on barrier layer 65. Preferably, dielectric layer 68 has a thickness ranging between 1,000 Å and 5,000 Å. By way of example, dielectric layer 68 has a thickness of about 2,500 Å and comprises a low κ dielectric material. Suitable examples of low κ dielectric materials have been described hereinbefore with reference to FIG. 1. A layer of photoresist is formed on dielectric layer 68. The photoresist layer is patterned such that portions 70 remain over dielectric layer 68.

Referring now to FIG. 4, dielectric layer 68 is anisotropically etched using an anisotropic reactive ion etch. The anisotropic etch stops or terminates in or on barrier layer 65. The portions 72 of dielectric layer 68 having top surface 69 underlying photoresist 70 are protected from the anisotropic etch. Thus, dielectric portions 72 remain after the anisotropic etch. Photoresist portions 70 are removed using techniques known to those skilled in the art.

A barrier layer 74 having a thickness ranging between approximately 10 Å and approximately 1,000 Å is formed on dielectric portions 72 of dielectric layer 68 and on the portions of barrier layer 65 not covered by dielectric portions 72. Preferably barrier layer 74 is made from the same material as barrier layer 48 using the same processing technique described with reference to FIG. 2. A film or layer of an electrically conductive material 76 having a thickness ranging between approximately 100 Å and approximately 9,000 Å is formed on barrier layer 74. By way of example, layer 76 is copper which is plated on barrier layer 74 as described with reference to layer 52 shown in FIG. 2. Copper film 76 and the portion of barrier layer 74 over dielectric portions 72 are planarized using, for example, a Chemical Mechanical Polishing (CMP) technique having a high selectivity to dielectric layer 72. A barrier layer 79 having a thickness ranging between approximately 10 Å and approximately 1,000 Å is formed on copper film 76. Preferably barrier layer 79 is made from the same material as barrier layer 48 using the same processing technique described with reference to FIG. 2. As those skilled in the art are aware, barrier layer 79 can be formed over copper layer 76 or copper layer 76 may be recessed and barrier layer 79 deposited to fill the recessed portions. Layers 62, 64, and 65 cooperate with layers 74, 76, and 79 to form a test element 80. By way of example, layers 65, 74, 76, and 79 cooperate to form a vertically oriented extension.

Referring now to FIG. 5, a layer of dielectric or insulating material 82 having a thickness ranging between approximately 100 Angstroms and approximately 10,000 Å is formed on barrier layer 79 and on dielectric portions 72. Preferably, dielectric layer 82 has a thickness ranging between 1,000 Å and 5,000 Å. By way of example, dielectric layer 82 has a thickness of about 2,500 Å and comprises a low κ dielectric material. Suitable examples of low κ dielectric materials have been described hereinbefore with reference to FIG. 1. A layer of photoresist is formed on dielectric layer 82. The photoresist layer is patterned such that portions 84 remain over dielectric layer 82.

Referring now to FIG. 6, dielectric layer 82 is anisotropically etched using an anisotropic reactive ion etch. The anisotropic etch stops or terminates in or on dielectric portions 72 of dielectric layer 68. The portions 86 of dielectric layer 82 having top surface 85 underlying photoresist 84 are protected from the anisotropic etch. Thus, dielectric portions 86 remain after the anisotropic etch. Photoresist portions 84 are removed using techniques known to those skilled in the art.

A barrier layer 88 having a thickness ranging between approximately 10 Å and approximately 1,000 Å is formed on dielectric portions 72 and 86. Preferably barrier layer 88 is made using the same material and processing techniques as barrier layer 48 as described with reference to FIG. 2. A film or layer of an electrically conductive material 90 having a thickness ranging between approximately 100 Å and approximately 9,000 Å is formed on barrier layer 88. By way of example, layer 90 is copper which is plated on barrier layer 88 as described with reference to layer 52 shown in FIG. 2. Copper film 90 may be planarized using, for example, a Chemical Mechanical Polishing (CMP) technique.

A barrier layer 92 having a thickness ranging between approximately 10 Å and approximately 1,000 Å is formed on copper film 90. Preferably barrier layer 92 is made using the same material and processing techniques as barrier layer 48 as described with reference to FIG. 2. A layer of dielectric or insulating material 94 having a thickness ranging between approximately 100 Angstroms and approximately 10,000 Å is formed on barrier layer 92.

Layers 88, 90, and 92 cooperate to form an extrusion monitoring element 96. By way of example, layers 88, 90, and 92 cooperate to form a vertically oriented extension facing major surface 16. Extrusion monitoring elements 53 and 96 cooperate with notced test element 80 to form a flux divergence induced monitoring structure suitable for monitoring the formation of conductor extrusion in a direction towards or away from major surface 16, i.e., in a vertical direction.

For the sake of clarity, FIG. 6 has been re-drawn as FIG. 7. It should be understood that semiconductor component 10 shown in FIG. 6 has been re-drawn in FIG. 7 showing the electrical conductors as single elements for the sake of clarity. In other words, layers 32, 34, 36, 48, 52, and 55 are shown as a single layer of conductive material forming extrusion monitoring element 53. Likewise, layers 88, 90, and 92 have been shown as a single layer of conductive material forming extrusion monitoring element 96, and layers 62, 64, 65, 74, 76, and 79 have been shown as a single layer of conductive material forming test element 80. Referring to FIG. 7, in operation a current is introduced into test element 80 as indicated by arrows 97. Initially, test element 80 is electrically isolated from extrusion monitoring elements 53 and 96. Thus, the resistance between test element 80 and each of extrusion monitoring elements 53 and 96 is very high (approaching infinity). As the current flows, copper atoms migrate into the dielectric material that separates extrusion monitoring elements 53 and 96 from test element 80. The early stages of copper migration from test element 80 to extrusion monitoring element 53 is indicated by broken lines 98. If the copper atoms of test element 80 migrate all the way to extrusion monitoring element 53, test element 80 becomes shorted to extrusion monitoring element 53 as indicated by copper extrusion region 98A. When shorted, the resistance between test element 80 and extrusion monitoring element 53 approaches zero. Likewise, the early stages of copper migration from test element 80 to extrusion monitoring element 96 are indicated by broken lines 99. If the copper atoms of test element 80 migrate to extrusion monitoring element 96, test element 80 becomes shorted to extrusion monitoring element 96 as indicated by copper extrusion region 99A. When shorted, the resistance between test element 80 and extrusion monitoring element 96 approaches zero. Thus, extrusion monitoring elements 53 and 96 in combination with test element 80 are used to monitor a response parameter, e.g., resistance, resulting from the application of a test signal, e.g., current, through test element 80. When a short occurs, the resistance approaches zero indicating extrusion of copper in a vertical direction.

Figure 8:
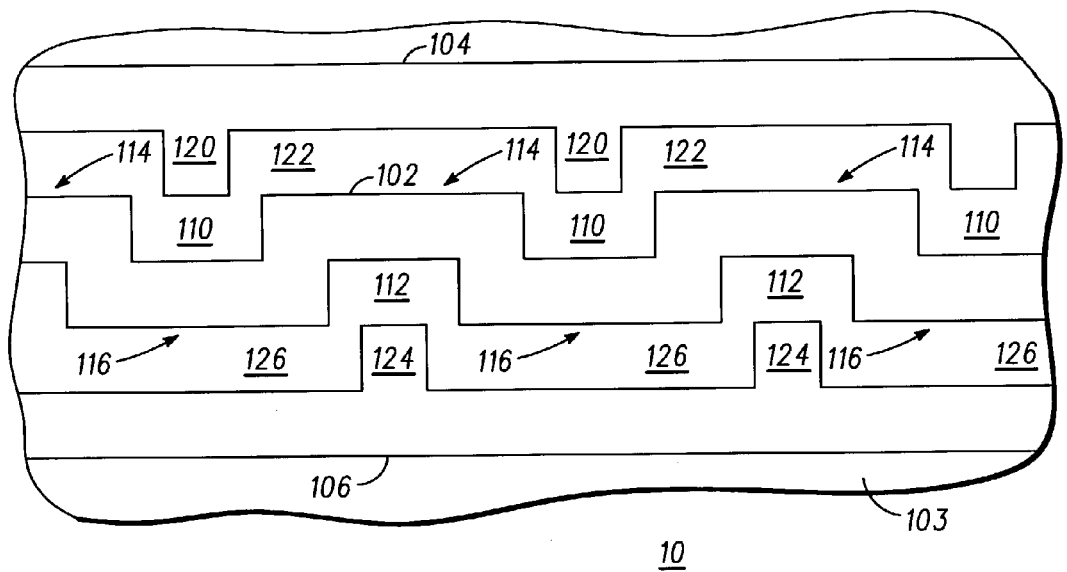
FIG. 8 is a top view of a portion of the semiconductor component.

In addition, semiconductor component 10 includes a flux divergence induced monitoring structure suitable for monitoring conductor extrusion in a direction substantially parallel to major surface 16. Referring now to FIG. 8, a top view of a test element 102 positioned between extrusion monitoring elements 104 and 106 is shown. Test element 102 is formed by patterning an electrically conductive material over a dielectric material having a surface 103. Preferably, the conductive material of test element 102 is copper. To prevent diffusion of copper into the underlying dielectric material, a barrier material such as, for example, tantalum is formed between the copper and the dielectric material. In addition, the barrier material improves copper adhesion. Test element 102 may have a serpentine pattern such that notches 110 are formed from one side of the copper and notches 112 are formed from the opposing side of the copper. Conductive portions 114 are separated by notches 110 and conductive portions 116 are separated by notches 112.

Extrusion monitoring element 104 is patterned to have a plurality of extensions 120 alternating with notches 122. Extensions 120 are adjacent corresponding notches 110 of test element 102 and notches 122 are adjacent corresponding conductive portions 114 of test element 102. Extrusion monitoring element 106 is patterned to have a plurality of extensions 124 alternating with notches 126. Extensions 124 are adjacent corresponding notches 112 of test element 102 and notches 126 are adjacent corresponding conductive portions 116 of test element 102.

Figure 9:
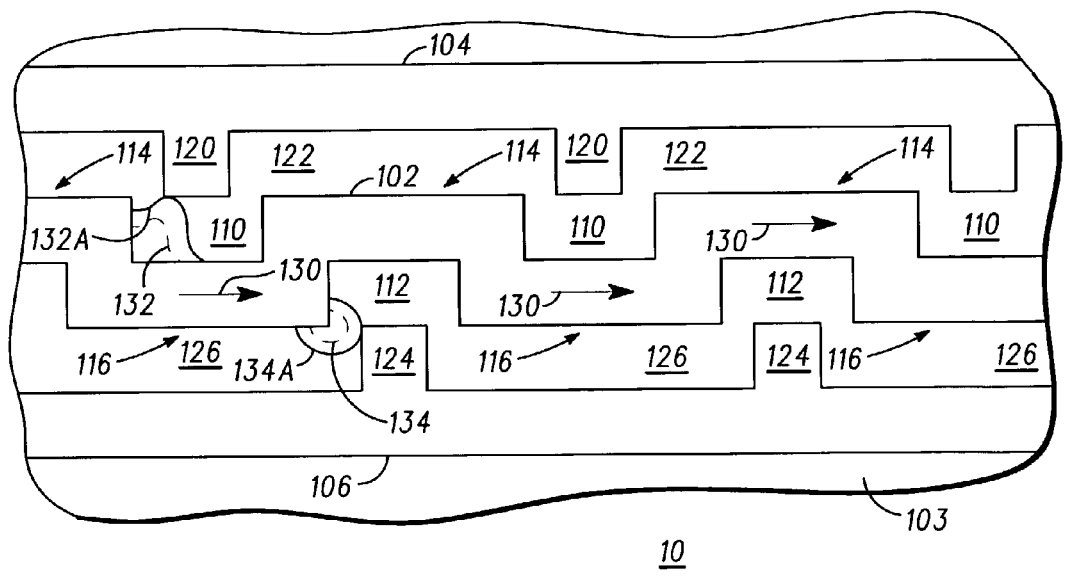
FIG. 9 is a top view of the portion of the semiconductor component during operation.

In operation, a current is introduced into test element 102 as indicated by arrows 130 of FIG. 9. Initially, test element 102 is electrically isolated from extrusion monitoring elements 104 and 106. Thus, the resistance between test element 102 and each of extrusion monitoring elements 104 and 106 is very high (approaching infinity). As the current flows, copper atoms migrate into the dielectric material separating extrusion monitoring elements 104 and 106 from test element 102. The early stages of copper migration from test element 102 to extrusion monitoring element 104 are indicated by broken lines 132. If the copper atoms of test element 102 migrate all the way to extrusion monitoring element 104, test element 102 becomes shorted to extrusion monitoring element 104 as indicated by copper extrusion region 132A. When shorted, the resistance between test element 102 and extrusion monitoring element 104 approaches zero. Likewise, the early stages of copper migration from test element 102 to extrusion monitoring element 106 are indicated by broken lines 134. If the copper atoms of test element 102 migrate to extrusion monitoring element 106, test element 102 becomes shorted to extrusion monitoring element 106 as indicated by copper extrusion region 134A. When shorted, the resistance between test element 102 and extrusion monitoring element 106 approaches zero. Thus, extrusion monitoring elements 104 and 106 in combination with test element 102 are used to monitor a response parameter, e.g., resistance, resulting from the application of a test signal, e.g., current, through test element 102. When a short occurs, the resistance approaches zero indicating extrusion of copper in a lateral direction.

By now it should be appreciated that a semiconductor component having a flux divergence induced failure monitoring structure, a method for manufacturing the semiconductor component, and a method for monitoring flux divergence induced failure have been provided. An advantage of the present invention is that the monitoring structure can be integrated with a semiconductor device which allows monitoring whether adjacent electrical interconnects of the metallization system have become shorted together. Further, the monitoring structure is a multi-dimensional monitoring structure capable of detecting whether vertically adjacent electrical conductors have become shorted, whether laterally adjacent electrical conductors have become shorted, or whether both vertically and laterally adjacent electrical conductors have become shorted. The present invention provides a method for detecting electrical shorts in metallization systems in general and in copper metallization systems using a low κ dielectric materials.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law. For example, rather than forming the extrusion monitoring elements on both sides of the notched test element, an extrusion monitoring element may be formed on only one side. Moreover, notches may be formed in the extrusion monitoring elements and extensions formed in the notched test element, wherein the extensions are aligned to the notches. In addition, the notched test element can be a unitary structure having vertically and laterally extending notches, where the notched test element is vertically positioned between a pair of extrusion monitoring elements and laterally positioned between a pair of extrusion monitoring elements.

What is claimed is:

1. A method for manufacturing a monitoring structure for use in a semiconductor component, comprising:
providing a semiconductor substrate having a major surface;
forming a first extrusion monitoring element over the major surface;
forming a second extrusion monitoring element spaced apart from the first extrusion monitoring element; and
forming a test element having a notched portion between the first and second extrusion monitoring elements.

2. The method of claim 1, further including forming a portion of the test element laterally positioned between the first and second extrusion monitoring elements.

3. The method of claim 1, further including forming a portion of the test element over a portion of the first extrusion monitoring element and forming a portion of second extrusion monitoring element over a portion of the test element.

4. The method of claim 1, wherein forming the first extrusion monitoring element comprises forming the first extrusion monitoring element as a first damascene structure.

5. The method of claim 4, wherein the first damascene structure is a dual damascene structure.

6. The method of claim 4, wherein forming the second extrusion monitoring element comprises forming the second extrusion monitoring element as a second damascene structure.

7. The method of claim 4, further including forming a third extrusion monitoring element, the third extrusion monitoring element laterally adjacent a first side of the test element.

8. The method of claim 7, further including forming a fourth extrusion monitoring element laterally adjacent a second side of the test element.

9. The method of claim 7, wherein forming the test element comprises forming the test element as a third damascene structure.

10. The method of claim 9, wherein forming the third and fourth extrusion monitoring elements comprises forming the third and fourth extrusion monitoring elements as third and fourth damascene structures, respectively.

11. The method of claim 10, wherein the third and fourth extrusion monitoring elements comprise copper.

12. A method for monitoring a metallization system of a semiconductor component, comprising:
providing a semiconductor substrate having a major surface;
forming a first extrusion monitoring element over the major surface;
forming a second extrusion monitoring element spaced apart from the first extrusion monitoring element;
forming a test element between the first and second extrusion monitoring elements, the test element having a notched portion between the first and second extrusion monitoring elements;
applying a test signal through the test element; and
monitoring a response parameter, the response parameter in a first state indicating a change in a condition of the metallization system.

13. The method of claim 12, wherein forming the first extrusion monitoring element comprises forming a first electrically conductive interconnect having a vertically oriented extension.

14. The method of claim 13, wherein forming the test element includes forming a current conducting structure having a notch, the notch patterned to cooperate with the vertically oriented extension.

15. The method of claim 14, wherein forming the second extrusion monitoring element comprises forming a second electrically conductive interconnect having a vertically oriented extension and forming the test element includes forming another notch in the current conducting structure, the another notch patterned to cooperate with the vertically oriented extension.

16. The method of claim 12, wherein applying a test signal through the test element comprises conducting a current through the test element.

17. The method of claim 16, wherein monitoring the response parameter comprises monitoring a resistance between at least one of the first extrusion monitoring element and the test element or the second extrusion monitoring element and the test element.

* * * * *